(12) United States Patent
Ayres et al.

(10) Patent No.: US 6,201,699 B1
(45) Date of Patent: Mar. 13, 2001

(54) TRANSVERSE MOUNTABLE HEAT SINK FOR USE IN AN ELECTRONIC DEVICE

(75) Inventors: John W. Ayres, Forney; Vincent Byrne, Mesquite; Edward C. Fontana, Rockwall; Steven C. Stein, Dallas, all of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/259,772

(22) Filed: Mar. 1, 1999

(51) Int. Cl.[7] ....................................... H05K 7/20
(52) U.S. Cl. ................... 361/707; 24/697; 174/16.3; 257/722; 257/727; 361/719
(58) Field of Search ................... 165/80.3, 185, 165/121; 174/16.3; 257/707, 722, 723, 724, 727; 361/690, 704, 707, 703, 709–711, 715, 722, 717–719, 695, 697; 454/184; 267/150, 158, 160; 248/316.7, 510; 24/457, 458, 625

(56) References Cited

U.S. PATENT DOCUMENTS

| | | |
|---|---|---|
| 3,219,885 * 11/1965 | Schniers . |
| 3,220,471 * 11/1965 | Coe . |
| 3,519,889 *  7/1970 | Monaco . |
| 3,566,959 *  3/1971 | Koltuniak . |
| 4,027,206 *  5/1977 | Lee . |
| 4,588,023 *  5/1986 | Munekawa . |
| 4,602,315 *  7/1986 | Breese . |
| 4,899,255 *  2/1990 | Case . |
| 5,170,325 * 12/1992 | Bentz . |
| 5,343,362 *  8/1994 | Solberg . |
| 5,461,542 * 10/1995 | Kosak . |
| 5,507,092 *  4/1996 | Akachi . |
| 5,719,745 *  2/1998 | Agonafer . |
| 5,808,869 *  9/1998 | Donahoe . |
| 5,854,738 * 12/1998 | Bowler . |
| 5,870,286 *  2/1999 | Butterbaugh . |
| 5,927,386 *  7/1999 | Lin . |
| 5,973,921 * 10/1999 | Lin . |
| 6,049,459 *  4/2000 | Edmonds . |

* cited by examiner

Primary Examiner—Gerald Tolin

(57) ABSTRACT

The present invention provides a heat sink that, in an advantageous embodiment, includes a spine having a width with first and second opposing sides that are oriented to be abnormal to the substrate when the heat sink is mounted on the substrate. The heat sink further includes an electronic device support leg that extends generally transverse from the first side and that is configured to support a heat generating electrical component thereon. Alternative embodiments of the present invention may include a plurality of such electronic device support legs. A plurality of cooling fins are also included in the present invention, extending from the second side. Moreover, each of the plurality of cooling fins has a depth that is substantially less than the width of the heat sink, which give this unique heat sink an exceptional cooling efficiency. In particular advantageous embodiments, the depth to width ratio of the fins and spine, may range from about 1 to 5 or 1 to 10, respectively.

31 Claims, 6 Drawing Sheets

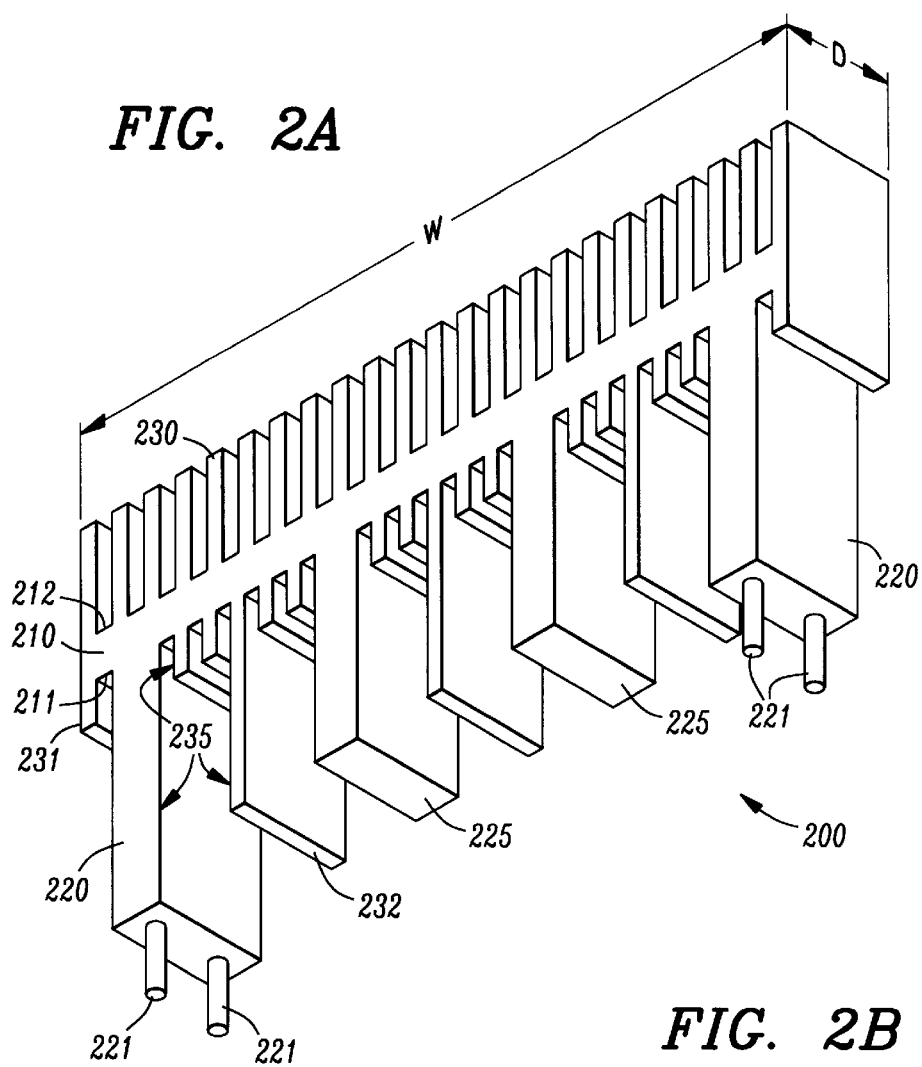
FIG. 2A
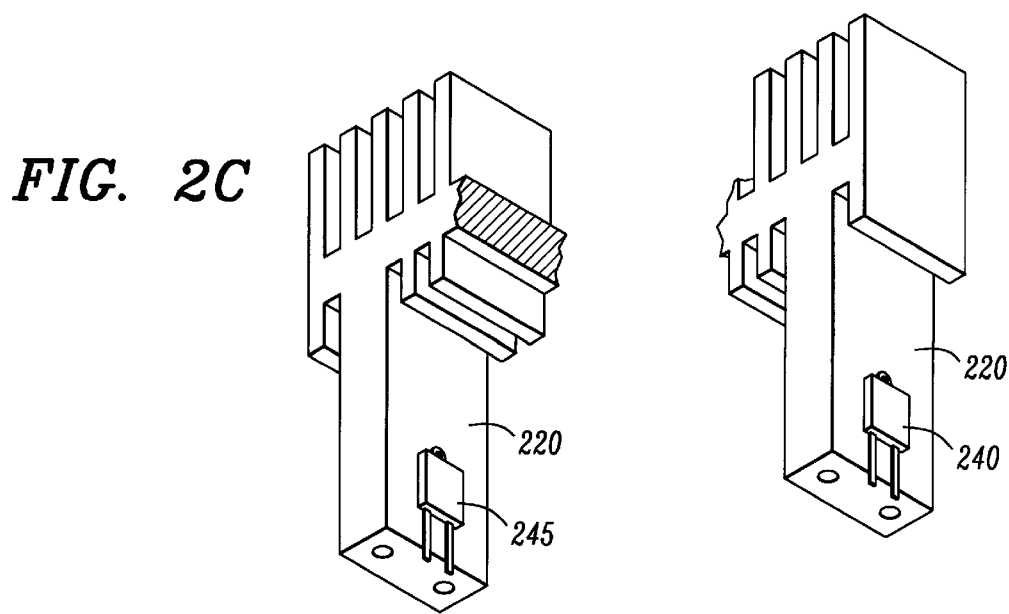
FIG. 2B
FIG. 2C

TRANSVERSE MOUNTABLE HEAT SINK FOR USE IN AN ELECTRONIC DEVICE

TECHNICAL FIELD OF THE INVENTION

The present invention is directed, in general, to a heat sink and, more specifically, to a transverse mountable heat sink for use in an electronic device.

BACKGROUND OF THE INVENTION

Certain electronic and electrical components and devices mounted on printed circuit and wiring boards generate considerable operating heat that, unless controlled, may result in temperature related circuit or component failure. The generally preferred control method is to use a heat sink to transfer component heat to the air.

A heat sink can be made of any material with favorable heat transfer characteristics, such as copper, aluminum or steel. Aluminum is generally preferred because it is inexpensive, easy to work with, lightweight, and has good heat transfer characteristics. The heat sink and heat generating component are usually placed in direct contact with one another to more efficiently cool the component.

In most cases, after the heat sink absorbs component heat, the heat is transferred to the surrounding air by conduction or convection. In order to facilitate heat transfer, heat sinks frequently have "fins" to increase the total surface area that serves to conduct or convect heat.

A typical printed wiring or circuit board may have a number of heat generating devices. That is why it is not unusual to have a number of heat sinks on a single circuit board associated with heat generating devices and components. Because circuits are frequently enclosed in cabinets or other enclosures, a fan is used to move air across the heat sink and facilitate the transfer of heat to the air.

When a number of heat sinks are required, design factors in addition to temperature control must be taken into consideration. When a printed circuit or wiring board requires a number of heat sinks, the area of the board occupied by heat sinks will often constitute a significant fraction of the total board space. Similarly, a significant fraction of the total volume available to house a circuit will be taken up by heat sinks when a number of heat sinks are required. Because the total area required for heat sinks may be significant, the board size is often dictated by heat sink requirements. Another factor designers must consider is total heat sink weight when a number of heat sinks are required. Designers, therefore, must address heat dissipation problems from a space and weight viewpoint in designing electronic equipment in order to produce the highly valued small electronics system that some customers prefer.

Accordingly, what is needed in the art is a heat sink design that can efficiently cool a number of heat generating devices or components while utilizing a minimum amount of space on a printed wiring or circuit board and a minimum volume within the enclosure.

SUMMARY OF THE INVENTION

To address the above-discussed deficiencies of the prior art, the present invention provides a heat sink, which in one advantageous embodiment, includes a spine that has a width and first and second opposing sides that are oriented to be abnormal to the substrate when the heat sink is mounted on the substrate. The heat sink further includes an electronic device support leg that extends generally transversely from the first side and that is configured to support a heat generating electrical component thereon. Alternative embodiments of the present invention may include a plurality of such electronic device support legs.

A plurality of cooling fins extending from the spine are also included in the above-discussed embodiment. Moreover, each of the plurality of cooling fins has a depth that is substantially less than the width of the heat sink, which gives this unique heat sink an exceptional cooling efficiency. In particular advantageous embodiments, the depth to width ratio of the fins and spine, respectively, may range from about 1 to 5 or 1 to 10. However, in a particularly useful embodiment, the ratio is 1 to 5; that is, the depth of each fin is ⅕ of the width of the spine. In this embodiment, cooling fins extend from the first side and are positioned adjacent the electronic device support leg and, in certain applications, may be different lengths.

In another embodiment, the electronic device support leg depends from the first side of the spine, and the cooling fins extend substantially transversely from the second side and the first side.

In certain embodiments it may be advantageous to mount the heat sink to the board without the need of bulky screws. In such embodiments, the electronic device support leg includes mounting pins located on its end. The mounting pins are configured to cooperatively engage a corresponding mounting port on the substrate.

In yet another embodiment, each of the cooling fins include a leading edge that extends in a direction substantially transverse to the spine. In those embodiments where there is a plurality of electronic device support legs, the heat sink may further include electronic components attached to opposite sides of each leg. Spatial separation of the legs allows air to flow between the legs and over the devices, thereby providing a more efficient cooling system.

The electronic components may be attached to the electronic device support legs with a spring clip. In certain embodiments, the spring clip may be designed to have a low drag shape configured to delay separation of airflow passing over it. Likewise, in certain embodiments, the cooling fins may have a low drag shape configured to delay separation of airflow passing over them.

The foregoing has outlined, rather broadly, preferred and alternative features of the present invention so that those who are skilled in the art may better understand the detailed description of the invention that follows. Additional features of the invention are hereinafter described that form the subject of the claims of the invention. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIGS. 2A–2D illustrate an embodiment of a heat sink constructed in accordance with the present invention;

DETAILED DESCRIPTION

Figure 1A:
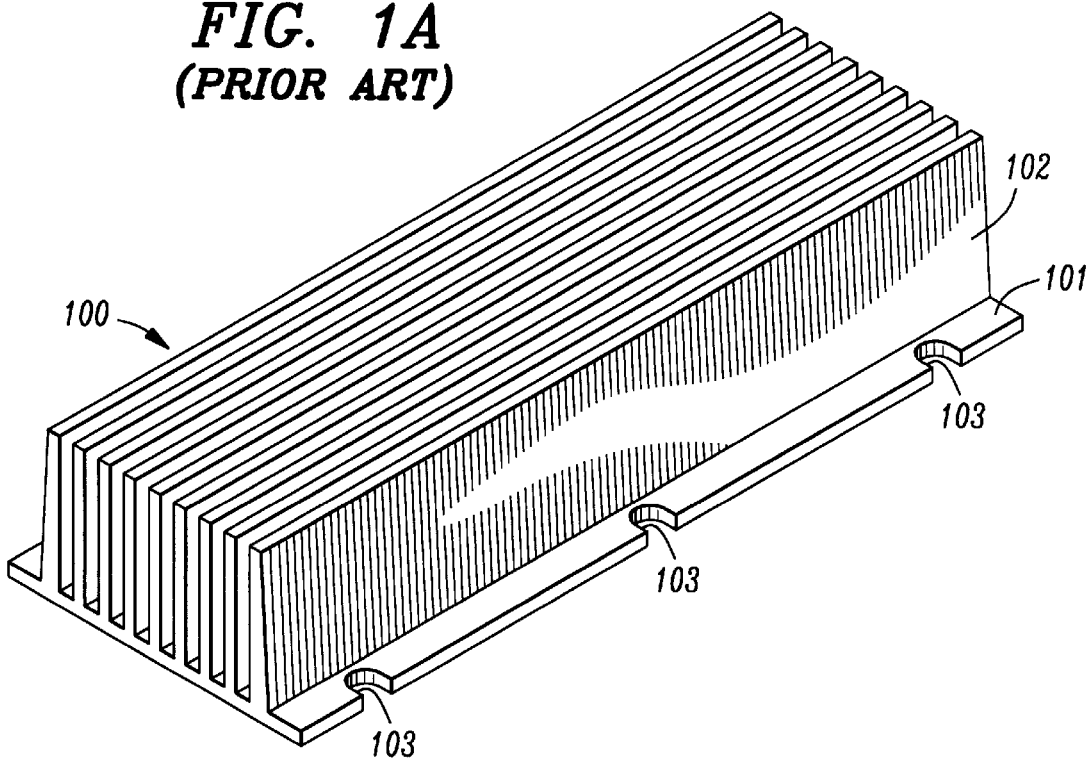
FIGS. 1A–1B illustrate embodiments of prior art heat sinks.
Figure 1B:
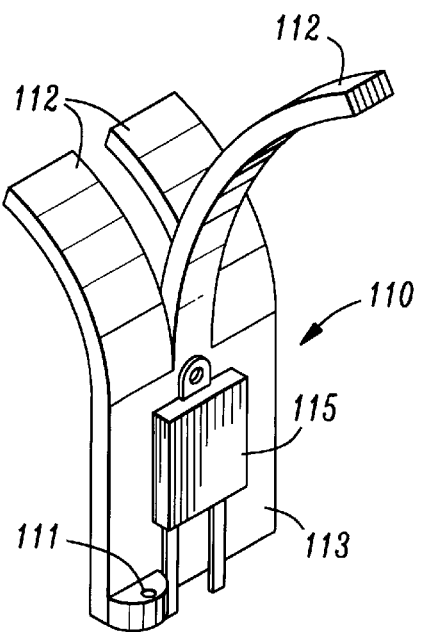

Referring initially to FIGS. 1A and 1B, illustrated are examples of prior art heat sinks 100, 110. The prior art heat sink 100 illustrated in FIG. 1A is for mounting directly to a rectangular electronic device or component that generates heat, such as a power supply. The bottom plate 101 of the heat sink 100 has a series of cooling fins 102 extending from it and a series of slots 103 along the edge that can be used to fasten the heat sink 100 directly to a heat generating device or component. As thus mounted, the direct contact of the bottom plate 101 with the device permits the device to transfer heat directly to the heat sink 100. The heat absorbed by the heat sink 100 is dispersed throughout the structure of the heat sink 100, including its cooling fins 102. The cooling fins 102 then transfer the heat into the surrounding air by conduction or convection. When a fan facilitates the movement of air across the heat sink 100, the direction of air flow parallels the surface of the cooling fins 102.

FIG. 1B illustrates another prior art heat sink 110. This heat sink 110 is designed so that a heat generating component 115 is mounted directly to the heat sink 110. The component 115 is typically mounted to the heat sink 110 by conventional screws or bolts or a combination of clamping plates and bolts or screws. The heat sink 110 can also be fastened to a circuit or wiring board by the same type of fasteners as described above. In this case, screw holes 111 are provided to mount the heat sink 110 on the board. This heat sink 110 also has multiple cooling fins 112 that extend from the floor plate 113. FIG. 1B illustrates that, as a general rule, the board space required to accommodate a heat sink 110 together with its associated component 115 is larger than the space that would be required if only the component itself had to be accommodated. In short, the proportionate size or footprint of the heat sink 110 is significantly larger than the size or footprint of its associated component 115. This is a distinct disadvantage if space is a limiting factor.

It is not unusual for several heat sinks to be required on a circuit or wiring board in order to control the heat generated by multiple devices and components. Because heat sinks generally have a significantly larger footprint than their associated components, a heat sink design that can provide heat control for several devices that would otherwise require multiple heat sinks is highly desirable, particularly for the more compact electronic devices many customers prefer.

If the number of heat sinks on a circuit or wiring board can be reduced, fewer parts will be required to assemble the electronic device. If fewer parts are required the total manufacturing cost, both with respect to total part cost as well as assembly cost, will be less. The present invention addresses the space, weight and cost problems discussed above that are inherent when multiple heat sinks are used, without impairing the ultimate objective of heat control.

Figure 2D:
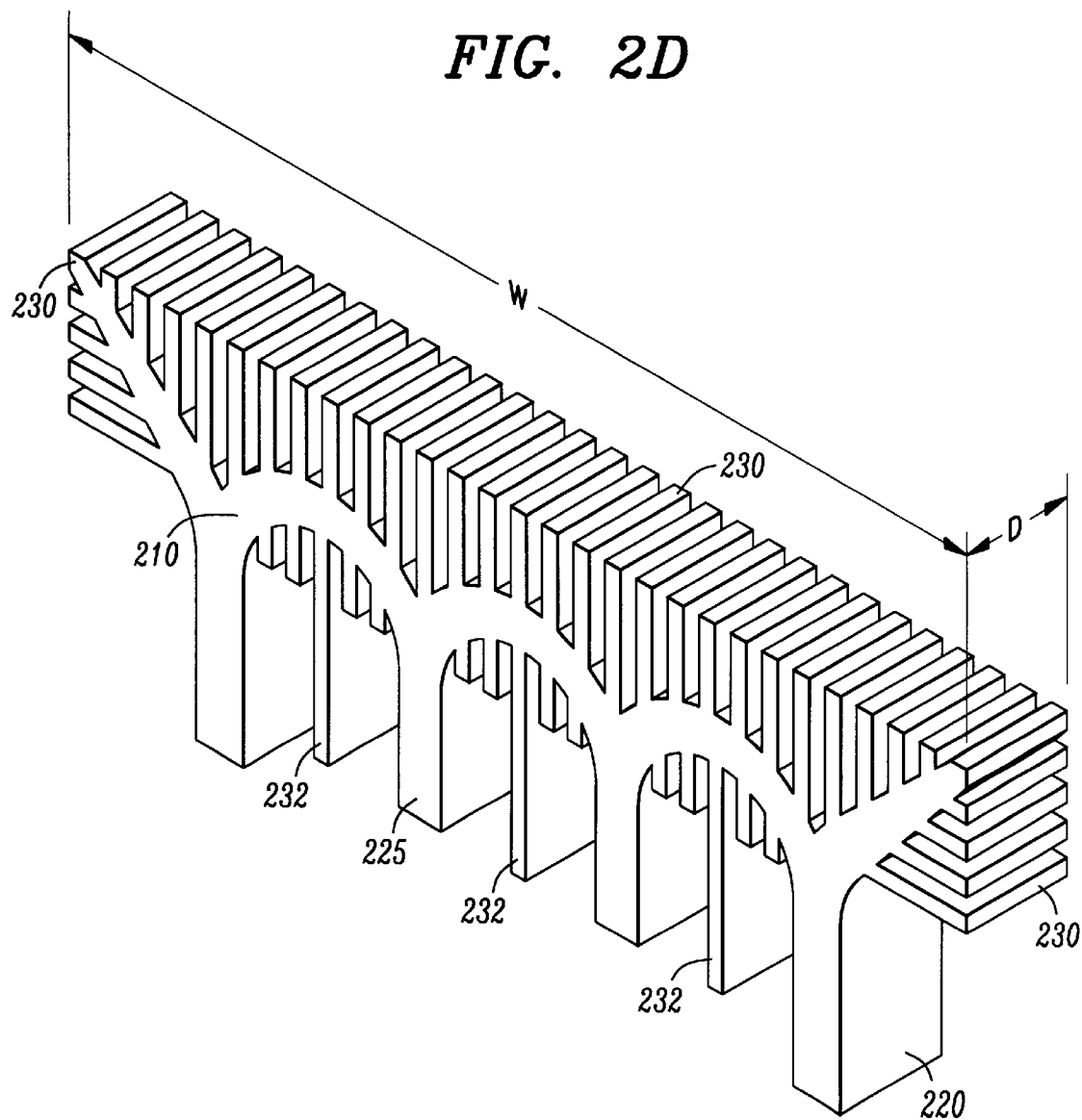

FIG. 2A illustrates an embodiment of the present invention. The heat sink 200 has a longitudinal spine 210 with an opposing first side 211 and second side 212. When mounted to the surface of a circuit or wiring board (not shown), the opposing first side 211 and second side 212 of the spine 210 are parallel, or at an angle other than a normal angle, to the surface of the board (i.e., abnormal). In the embodiment illustrated, the spine 210 is designed to be parallel with the surface of the board when the heat sink 200 is mounted on the board.

Extending from the first side 211 of the spine 210 are electronic device support legs 220, 225, configured so that each leg 220, 225 can support two electronic devices or components on opposing side of the support legs 220, 225. FIG. 2B illustrates one side of a support leg 220 with an electronic component 240 mounted on it by screws, clips, or other generally recognized mounting method. FIG. 2C illustrates the reverse side of the support leg 220 with another electronic component 245 mounted on it. The heat sink 200 illustrated in FIG. 2A has four electronic device support legs 220, 225 and can mount eight electronic components 240, 245. In one embodiment of the present invention the support legs 220, 225 have a thermal pad (not shown) covering at least a portion thereof.

Referring again to FIG. 2A, two of the support legs 220 can be used to attach or mount the heat sink 200 to a circuit or wiring board and thus can serve as support legs for the heat sink 200. At the end of each of the two legs 220 that attach to the circuit or wiring board are pins 221 that engage corresponding ports on the board (not shown). In another embodiment, the pins 221 will have snaps or a claw type of fastener to secure the heat sink 200 to the board. This method of mounting is superior to prior art methods because it provides more mechanical stability and eliminates the need for additional fasteners. This aspect of the present invention is discussed in more detail below with respect of FIG. 4B.

Extending from the second side 212 of the spine 210 are several cooling fins 230. Although this embodiment has a symmetrical array of cooling fins 230, those skilled in the art will recognize that cooling fins 230 may be of a varying length and may extend from the second side at varying angles and still be within the scope of the claimed invention such as the embodiment illustrated in FIG. 2D.

The heat sink 200 has supplemental cooling fins 231, 232 extending from the first side 211. As shown in FIG. 2A, some of the supplemental cooling fins 232 extending from the first side 211 are substantially longer than the other fins 231 in order to provide improved cooling performance at low air velocities. The actual number and length of cooling fins 230, 231, 232 used on a heat sink 200 can vary and still be within the intended scope of the invention.

When the illustrated heat sink 200 is mounted on a circuit or wiring board, it is positioned so the cooling fan circulates air in a direction substantially perpendicular to the width of the spine 210 and substantially parallel to the surface of the cooling fins 230, 231 232. Each cooling fin 230, 231, 232 has a leading edge 235 over which air flow generated by the cooling fan first passes. As the airflow travels past the leading edge 235, a boundary layer forms along the cooling fin 230, 231, 232 surface. The thickness of the boundary layer at the leading edge 235 approaches zero and increases the further the airflow progresses away from the leading edge 235 along the fin 230, 231, 232 surface across the depth of the heat sink 200. The air temperature at the leading edge 235 is the ambient temperature of the air and increases as the distance increases along the surface of the cooling fin 230, 231, 232 away from the leading edge 235. As airflow travels across the depth of the heat sink 200, heat is transferred by conduction and convection into the air with the rate of heat transfer increasing with the difference in temperature between the heat sink 200 and the air.

It has been found, in the present invention, that to maximize heat transfer per unit volume of air flowing across the fins 230, 231, 232, it is advantageous to maximize the leading edge by making the width (W) of the heat sink 200 substantially longer than the overall depth (D) of the fins 230, 231, 232. In a particular advantageous embodiment, the plurality of cooling fins 230, 231, 232 have a depth (D) substantially less than the width (W) of the heat sink 200, which gives this unique heat sink an exceptional cooling efficiency. In advantageous embodiments, the depth to width ratio of the fins 230, 231, 232 and spine, respectively, may range from about 1 to 5 or 1 to 10. However, in a particularly useful embodiment, the ratio is 1 to 5; that is, the depth (D) of each fin 230, 231, 232 is ⅕ of the width (W) of the spine 210 of the heat sink 230.

Because the transfer of heat from the heat sink 200 to the air is more efficient at the leading edges 235 of the fins 230, 231, 232, there is more total leading edge 235 available, which provides a more efficient heat sink 200. Therefore, the illustrated heat sink 200 is particularly efficient because of the abundance of leading edges 235 and because of the efficient depth to width ratio as previously discussed. This unique heat sink therefore provides a maximum amount of heat transfer from several electrical components attached to the heat sink while using a fraction of the space and weight that would be required if prior art heat sinks were used. The depth of the heat sink 200 is dictated by the size of the components 240, 245 associated with it. In particularly efficient embodiments, the heat sink's 200 depth is preferably only slightly larger than the depth of the largest component 240, 245.

Figure 3:
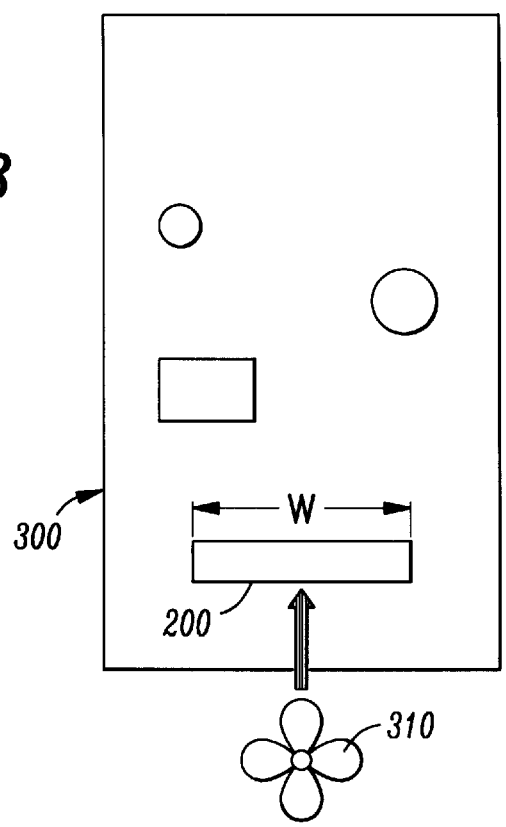
FIG. 3 illustrates a representation of a printed wiring or circuit board with a heat sink mounted thereon.

Turning now to FIG. 3, illustrated is a circuit board 300 with a heat sink 200 installed thereon in a preferable configuration. In a preferred embodiment, the circuit board 300 includes a fan 310 that moves air across the circuit board 300. The heat sink 200 is installed in such a way as to orient its width (W) in a direction perpendicular to the air flow, which is indicated by the arrow.

Figure 4A:
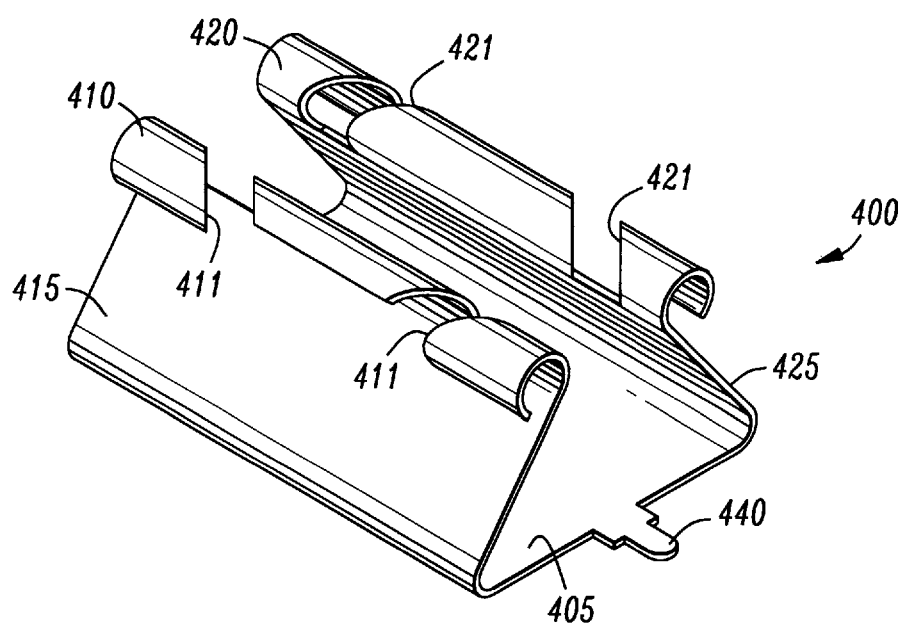
FIG. 4A illustrates an embodiment of a spring clip.

Turning now to FIG. 4A, illustrated is an embodiment of a clip 400 that, preferably, is used for fastening electronic devices to the electronic device support legs 220, 225. Those skilled in the art will recognize that electronic devices can also be fastened to the electronic device support legs 220, 225 by other methods.

The clip 400 is a single piece of metal that is bent so that it has a first clamping surface 410 at the end of a first opposing surface member 415 and a second clamping surface 420 at the end of a second opposing surface member 425, with the two clamping surfaces 410, 420 in opposition to one another. The metal has sufficient spring-like elasticity so that the two opposing surface members 415, 425 are predisposed to return to their original shape when displaced. To clamp an electronic device on the heat sink's 200 electronic device support leg 220, 225, the opposing first and second surface members 415, 425 are spread apart by using a spreading device inserted in the spreading slots 411, 421 located at the outer edges of the clamping surfaces 410, 420. This provides an efficient, quick and easy way to attach electrical components to the heat sink 200 without having to use screws or other types of fasteners. After the clip 400 is then positioned over the components on one of the support legs 220, 225, the spreading device is removed.

Figure 4B:
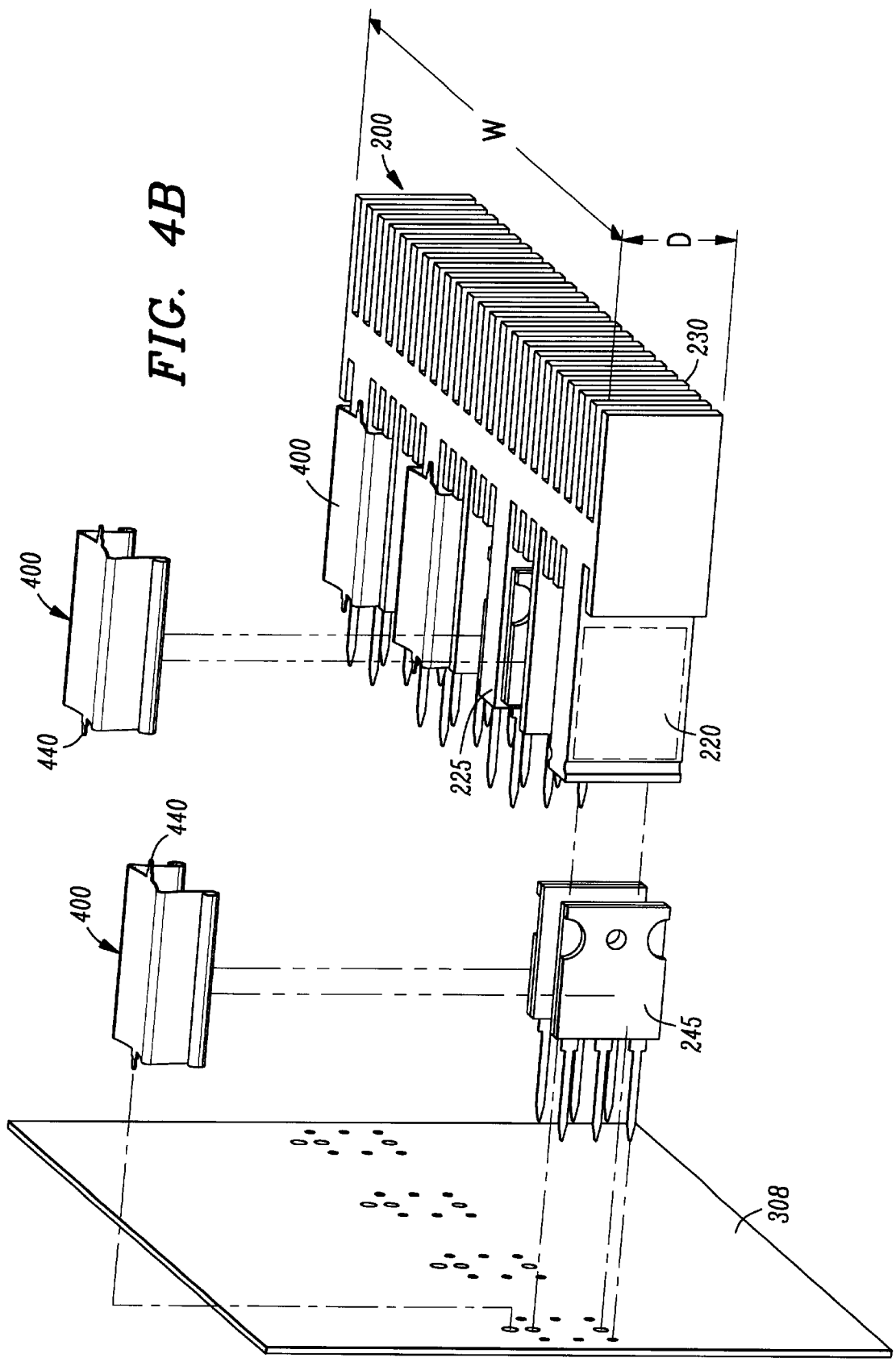
FIG. 4B illustrates an embodiment of a spring clip preferably used to fasten components to the device support legs of the heat sink.

Located on the periphery of the back 405 of the clip 400 is a fastening pin 440 that can be used to secure and align the clip 400 to a circuit or wiring board on which the heat sink 200 is mounted. The fastening pin 440 is configured to be received by a corresponding hole or opening formed on the circuit board and may be nickel and tin plated to allow for ease of soldering to the circuit board. The pin 440 can also be used to provide a path to electrically connect the component mounted on the clip 400 to the rest of the circuit mounted on the board. While not shown, the clip 400 may have a fastening pin 440 on opposing ends of the back 405 so that the possibly of incorrectly orienting the clip 400 is eliminated. FIG. 4B illustrates one way in which the clip 400 can be used to install an electrical component onto a device support leg 225 of the heat sink 200.

Figure 5A:
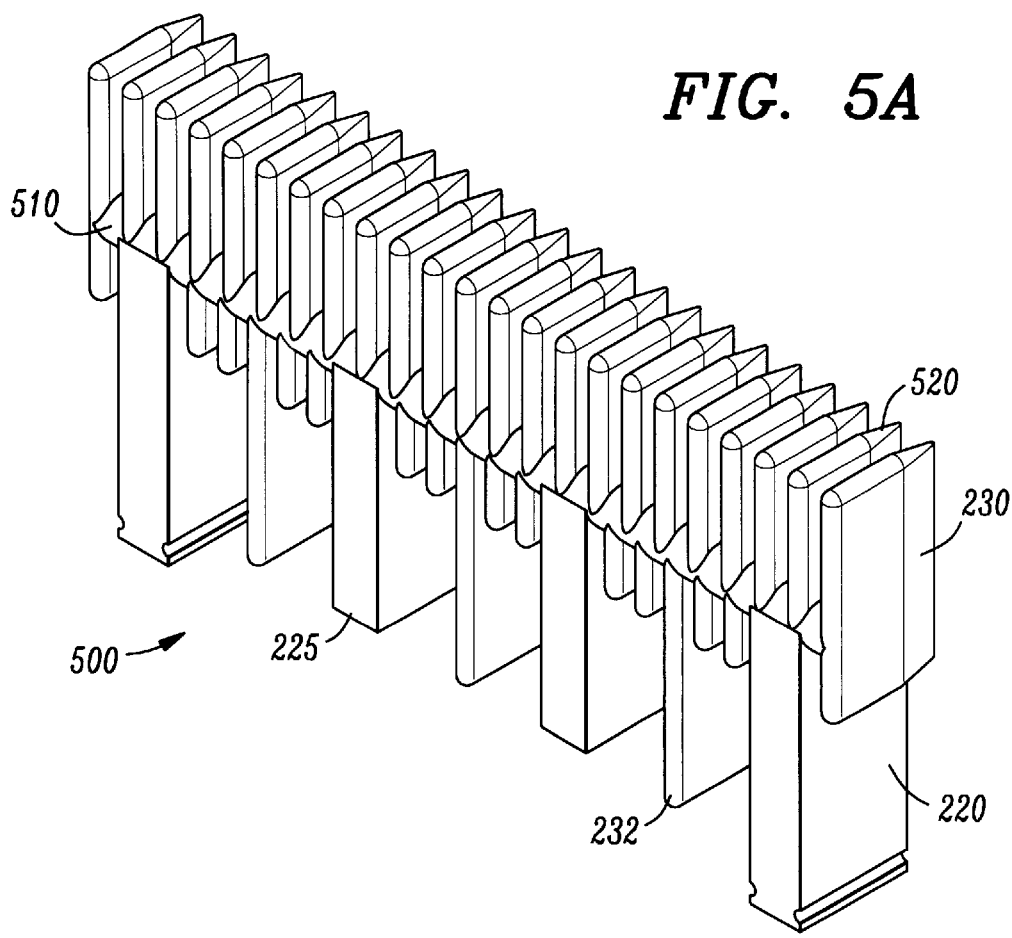
FIG. 5A illustrates a low drag embodiment of the invention.
Figure 5B:
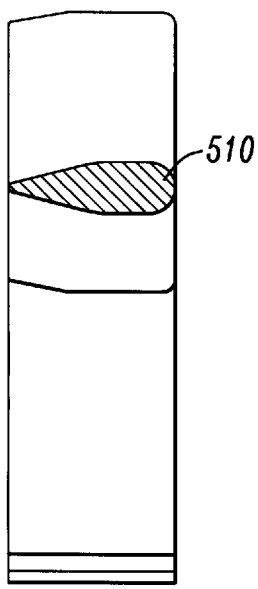
FIG. 5B illustrates a cross section view of the low drag embodiment of the invention showing the shape of the spine.
Figure 5C:
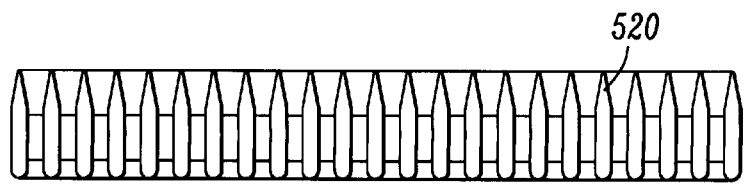
FIG. 5C illustrates the top view of the low drag embodiment of the invention showing the shape of the cooling fins.

Turning now to FIG. 5A illustrated is an embodiment of a heat sink 500 constructed in accordance with the present invention that has improved heat transfer characteristics. FIG. 5B illustrates a cross section view of this heat sink 500 embodiment showing a low drag shaped spine 510, such as a foil shaped configuration that is typically associated with an aircraft wing. FIG. 5C is a top view of the heat sink 500 embodiment showing the cooling fins 520 with a low drag shape such as that typically associated with an aircraft wing. This embodiment minimizes pressure drag such that substantially all of the pressure drag across the heat sink 500 is related to heat transfer.

In a similar fashion, the heat transfer characteristics of the clip 400 can also be improved by providing the clip 400 with a low drag shape similar to that of the fins, as discussed above. In such embodiments, the air flows across the clip 400 surface with minimal pressure drag.

An advantageous method of manufacturing will now be discussed. The heat sink 200 can be formed by any well known extrusion, casting, machining, or other manufacturing method. In a preferred embodiment, the heat sink 200 is extruded in such a way that the advantageous embodiments of the heat sink 200, as discussed above, will be incorporated. Once the heat sink 200 is formed, the required electrical components 240, 245 are attached to the electrical component support legs 220, 225 by using the above-discussed clip 400. The heat sink is then mounted on a printed wiring or circuit board on which various electrical components electrically have been attached. Ideally, the printed wiring or circuit board includes mounting holes configured to receive the heat sink's 200 mounting pins 221. The heat sink is then coupled to the printed wiring board by way of the mounting pins 221 engaging the board's mounting holes. The board typically has a cooling fan adjacent to the circuit or wiring board in order to provide cooling air transverse to the width of the heat sink 200. Of course, the board can include any embodiment or feature of the invention described herein and can be used in any electronic system, including a telecommunication, computer, or a power distribution system.

Although the present invention has been described in detail, those who are skilled in the art should understand that they can make various changes, substitutions and alterations herein without departing from the spirit and scope of the invention in its broadest form.

What is claimed is:

1. For use with an electronic component substrate, a heat sink, comprising:

a spine having a width and first and second opposing sides, said first and second opposing sides oriented to be abnormal to a substrate when said heat sink is mounted on said substrate;

at least two electronic device support legs extending generally transverse from said first side, each of said electronic device support legs configured to support a heat generating electrical component thereon; and a first set of a plurality of cooling fins extending from said second side of said spine, each of said first set having a depth that is substantially less than said width of said spine, and a plurality of supplemental cooling fins extending from a first side opposite that of said second side, said second set including a first supplemental cooling fin having a length less than that of said device support legs and a second supplemental cooling fin having a length less than said length of said first supplemental cooling fin.

2. The heat sink as recited in claim 1 wherein at least two of said electronic device support legs include mounting pins located on an end thereof, said mounting pins configured to cooperatively engage a corresponding mounting port on said substrate.

3. The heat sink as recited in claim 1 wherein each of said first set includes a leading edge that extends in a direction substantially transverse from either of said first and second opposing sides of said spine.

4. The heat sink as recited in claim 1 further comprising said support legs extending generally transverse from said first side.

5. The heat sink as recited in claim 1 wherein said electronic device support legs include electronic components attached thereto.

6. The heat sink as recited in claim 5 wherein said electronic components are attached to said electronic device support legs with a spring clip, said spring clip having a support back that includes a mounting pin integrally formed on an end of said support back and opposing clamping surfaces integrally formed with and along the sides of said support back.

7. The heat sink as recited in claim 1 wherein each of said first set has an air foil shape that is configured to delay separation of airflow passing thereover.

8. The heat sink as recited in claim 1 wherein said spine has an air foil shape that is configured to delay separation of airflow passing thereover.

9. The heat sink as recited in claim 1 wherein a ratio of said depth to said width ranges from about 1 to 5 to about 1 to 10.

10. For use with an electronic component substrate, a heat sink, comprising:

a spine having a width and first and second opposing sides, said fist and second opposing sides oriented to be abnormal to said substrate when said heat sink is mounted on said substrate;

at least two electronic device support legs extending from said first side, each of said electronic device support legs configured to support a heat generating electrical component thereon; and wherein at least one of said electronic device support legs include said electronic components attached to opposite sides thereof;

a plurality of cooling fins extending from said second side, each of said plurality of cooling fins having a depth that is substantially less than said width of said spine; and a plurality of supplemental cooling fins extending from said first side and positioned between said electronic device support legs.

11. The heat sink as recited in claim 10 wherein each of said electronic device support legs depend from said first side and said cooling fins extend substantially transverse from said first side or said second side of said spine.

12. The heat sink as recited in claim 11 wherein at least one of said supplemental cooling fins has a length that is longer than a length of a remainder of said supplemental cooling fins for heat transfer during low air velocity conditions.

13. The heat sink as recited in claim 10 wherein at least one of said electronic device support legs include mounting pins located on an end of thereof, said mounting pins configured to cooperatively engage a corresponding mounting port on said substrate.

14. The heat sink as recited in claim 10 wherein each of said primary and supplementary cooling fins include a leading edge that extends in a direction substantially transverse to said first side or said second side of said spine.

15. The heat sink as recited in claim 10 further comprising said support legs extending generally transverse from said first side.

16. The heat sink as recited in claim 10 wherein said electronic components are attached to said at least one electronic device support leg with a spring clip, said spring clip having a support back that includes a mounting pin integrally formed on an end of said support back and opposing clamping surfaces integrally formed with and along the sides of said support back.

17. The heat sink as recited in claim 10 wherein each of said cooling fins has a low drag shape that is configured to delay separation of airflow passing thereover.

18. The heat sink as recited in claim 10 wherein said spine has an air foil shape that is configured to delay separation of airflow passing thereover.

19. The heat sink as recited in claim 10 wherein a ratio of said depth to said width ranges from about 1 to 5 to about 1 to 10.

20. The heat sink as recited in claim 10 wherein each of said cooling fins has an air foil shape that is configured to delay separation of airflow passing thereover.

21. For use with an electrical system, a power circuit module, comprising:

a printed wiring board (pwb) substrate having electrical components electrically coupled thereto;

a heat sink coupled to said substrate, said heat sink including:

a spine having a width and first and second opposing sides, said first and second opposing sides oriented to be abnormal to said substrate when said heat sink is mounted on said substrate;

an electronic device support leg extending generally transverse from said first side, said electronic device support leg configured to support a heat generating electrical component thereon; and a first set of a plurality of cooling fins extending from said second side of said spine, each of said first set having a depth that is substantially less than said width of said spine, and a plurality of supplemental cooling fins extending from a first side opposite that of said second side, said second set including a first supplemental cooling fin having a length less than that of said device support less and a second supplemental cooling fin having a length less than said length of said first supplemental cooling fin.

22. The power circuit module as recited in claim 21 further including a cooling fan adjacent to said power circuit board, and;

said fan is configured to provide a flow of air across said power circuit board, said heat sink mounted on said pwb substrate such that said width of said heat sink is transverse to said flow of air.

23. The power circuit module as recited in claim 21 wherein said electronic device support leg includes mounting pins located on an end of thereof and said pwb substrate includes mounting ports, said mounting pins configured to engage said mounting ports on said pwb.

24. The power circuit module as recited in claim 21 wherein each of said first set include a leading edge that extends in a direction substantially transverse to said first side or said second side of said spine.

25. The power circuit module as recited in claim 21 further comprising a plurality of electronic device support legs.

26. The power circuit module as recited in claim 25 wherein each of said electronic device support legs include electronic components attached to opposite sides thereof.

27. The power circuit module as recited in claim 25 wherein said electronic components are attached to said electronic device support legs with a spring clip, said spring clip having a support back that includes a mounting pin integrally formed on an end of said support back and opposing clamping surfaces integrally formed with and along the sides of said support back.

28. The power circuit module as recited in claim 21 wherein each of first set has an air foil shape that is configured to delay separation of airflow passing thereover.

29. The power circuit module as recited in claim 21 wherein said spine has an air foil shape that is configured to delay separation of airflow passing thereover.

30. The power circuit module as recited in claim 21 wherein said power circuit module is selected from the group consisting of:

a telecommunication system module, a computer system module, and a power distribution system module.

31. The power circuit module as recited in claim 27 wherein said spring clip has an air foil shape that is configured to delay separation of airflow passing thereover.

* * * * *